United States Patent
Chung et al.

(10) Patent No.: US 7,767,576 B2
(45) Date of Patent: Aug. 3, 2010

(54) WAFER LEVEL PACKAGE HAVING FLOATED METAL LINE AND METHOD THEREOF

(75) Inventors: Hyun-soo Chung, Hwasung (KR); Seung-duk Baek, Yongin (KR); Ju-il Choi, Suwon (KR); Dong-ho Lee, Sungnam (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 517 days.

(21) Appl. No.: 11/556,931

(22) Filed: Nov. 6, 2006

(65) Prior Publication Data

US 2007/0176240 A1    Aug. 2, 2007

(30) Foreign Application Priority Data

Jan. 27, 2006    (KR) .................... 10-2006-0009062

(51) Int. Cl.
*H01L 21/4763*    (2006.01)
(52) U.S. Cl. .................... 438/622; 438/612; 257/690
(58) Field of Classification Search ............ 257/690, 257/459, E23.02; 438/612, 613, 622, 619
See application file for complete search history.

(56) References Cited

U.S. PATENT DOCUMENTS

| | | | | |
|---|---|---|---|---|
| 6,136,683 | A * | 10/2000 | Saito | 438/622 |
| 6,531,046 | B2 * | 3/2003 | Morrissey et al. | 205/219 |
| 6,713,870 | B2 | 3/2004 | Fang | |
| 6,806,570 | B1 | 10/2004 | Lee et al. | |
| 2006/0017161 | A1 * | 1/2006 | Chung et al. | 257/737 |

* cited by examiner

*Primary Examiner*—Ha Tran T Nguyen
*Assistant Examiner*—Shaun Campbell
(74) *Attorney, Agent, or Firm*—F. Chau & Associates, LLC

(57) ABSTRACT

A method of forming a wire structure connecting to a bonding pad of a semiconductor chip includes depositing a passivation layer on an active surface of the semiconductor chip, depositing a seed metal layer on the bonding pad and the passivation layer, depositing a metal layer on the seed metal layer, etching selected portions of the seed metal layer, leaving unetched a first area, overlapping the bonding pad and a second area overlapping a connection pad, wherein the wire structure is formed by the metal layer being electrically connected to the bonding pad and the connection pad, but floating from the passivation layer, and depositing an insulting layer on the wire structure.

22 Claims, 6 Drawing Sheets

# WAFER LEVEL PACKAGE HAVING FLOATED METAL LINE AND METHOD THEREOF

This application claims the priority under 35 USC §119 of Korean Patent Application No. 2006-0009062, filed on Jan. 27, 2006, the disclosure of which is incorporated by reference herein.

TECHNICAL FIELD

This disclosure is related to a method of forming a wire structure, and more particularly to a method of forming a wire structure connecting to a bonding pad of a semiconductor chip.

BACKGROUND OF THE INVENTION

Wafer-Level Packaging (WLP) refers to the technology of packaging an integrated circuit at wafer level, instead of the traditional process of assembling the package of each individual unit after wafer dicing. In the wafer-level packaging, processes such as, for example, wafer fabrication, packaging, test, and burn-in at wafer level can be integrated, thereby reducing costs and increasing throughput.

In the wafer-level packaging, a plurality of dies are formed on a wafer, and then a redistribution layer is formed over the dies. The redistribution layer includes a dielectric layer, a plurality of ball-pad arrays on the dielectric layer, and a redistributed metal line in the dielectric layer that are coupled to individual ball-pads of the ball-pad arrays. Each ball-pad array is arranged over a corresponding die, and the ball pads in an array are coupled to corresponding bond-pad of a die by the redistributed metal line. After forming the redistribution layer on the wafer, solder paste is deposited onto the individual ball pads. The solder paste is then reflowed to form small solder balls on the ball pads. After forming the solder balls, the wafer is cut into pieces.

FIG. 1 is a cross-sectional view showing a conventional wafer level package. Referring to FIG. 1, the wafer level package 101 includes a silicon substrate 111, a passivation layer 131, an aluminum (Al) pad 141, a redistributed metal line 161, a solder ball 181, a first polymer layer 151, and a second polymer layer 171. The passivation layer 131 and the Al pad 141 are formed on the silicon substrate 111. The first polymer layer 151 is formed on the passivation layer 131 and the Al pad 141. A seed metal layer 121 comprising, for example, Titanium (Ti) and Copper (Cu), is deposited on the first polymer layer 151. Then, a photoresist layer (not shown) is formed on the first polymer layer 151, and the photoresist layer is patterned. A metal such as, for example, a copper (Cu) and nickel (Ni), is deposited over the seed metal layer 121 to form a metal line using, for example, electroplating. The photoresist layer and the seed metal layer 121 below the photoresist layer are removed by etching. The second polymer layer 171 is formed on the first polymer layer 151 and the redistributed metal line 161. An opening is formed to expose an end portion of the redistributed metal line 161 positioned opposite the Al pad 141. Then, the opening is filled with a solder ball 181. The second polymer layer 171 covers the redistributed metal line 161 except for the opening. As can be seen from FIG. 1, the entire redistributed metal line 161 makes contact with the first or second polymer layers 151, 171.

Due to differences in expansion and contraction characteristics between metal and polymer, delamination between the redistributed metal line 161 and the first polymer layer 151 is prone to occur, and is so, the connection between the pad and the solder ball 181 using the metal line 161 is opened, causing the package to fail.

SUMMARY OF THE INVENTION

An exemplary embodiment of the present intention provides a wafer level package having a floated metal line.

According to an embodiment of the present invention, a method of forming a wire structure connecting to a bonding pad of a semiconductor chip includes depositing a passivation layer on an active surface of the semiconductor chip, depositing a seed metal layer on the bonding pad and the passivation layer, depositing a metal layer on the seed metal layer, etching selected portions of the seed metal layer, leaving unetched a first area, overlapping the bonding pad and a second area overlapping a connection pad, wherein the wire structure is formed by the metal layer being electrically connected to the bonding pad and the connection pad, but floating from the passivation layer, and depositing an insulating layer on the wire structure.

The method may further include forming an opening at the connecting pad to expose the metal layer, and filling the opening with an electrically conducive mass.

The method may further include forming an opening at the connection pad to expose the metal layer, and interconnecting a wire to the connection pad.

The size of the metal layer at the bonding pad may be made large than the size of the seed metal layer.

The seed metal layer can be made of titanium, copper, chromium, nickel, or an alloy of any combination thereof.

The seed metal layer can have a thickness of about 1000 to 5000 angstrom. The seed metal layer can be formed by sputtering.

The metal layer may include one of copper, chromium, nickel, gold, or an alloy of any combination thereof.

The metal layer may have a thickness of about 2 to about 10 micron.

Forming the metal layer may include electroplating or electrolessplating.

The conductive mass may include one of tin, lead or lead-free solder ball.

According to an embodiment of the present invention, a method of forming a wire structure connecting to a bonding pad in a semiconductor chip includes depositing a passivation layer on an active surface of the semiconductor chip, depositing a seed metal layer on the bonding pad and the passivation layer, depositing a metal layer on the seed metal layer, etching selected portions of the seed metal layer, leaving unetched a first area overlapping the bonding pad, a second area overlapping a connection pad, and a third area overlapping a metal pad in between the bonding pad and the connection pad, wherein the wire structure is formed by the metal layer being electrically connected to the bonding pad, the metal pad, and the connection pad, but otherwise floating from the passivation layer, and depositing an insulating layer on the wire structure.

According to an embodiment of the present invention, a semiconductor chip includes a bonding pad connecting to circuitry within the semiconductor chip, a passivation layer formed on an active surface of the semiconductor chip, a connection pad formed on the passivation layer, and a metal ire structure connecting the bonding pad and the connection pad, wherein the bonding pad and the connection pad includes a seed metal layer and a metal layer and the wire structure is covered by an insulation layer.

BRIEF DESCRIPTION OF DRAWINGS

Exemplary embodiment of the present invention can be understood in more detail from the following description taken in conjunction with the accompanying drawings in which.

DETAILED DESCRIPTION OF EXEMPLARY EMBODIMENTS

Exemplary embodiments of the present invention will now be described more fully hereinafter below in more detail with reference to the accompanying drawings. This invention may, however, be embodied in different forms and should not be construed as limited to the exemplary embodiments set forth herein.

Figure 1:
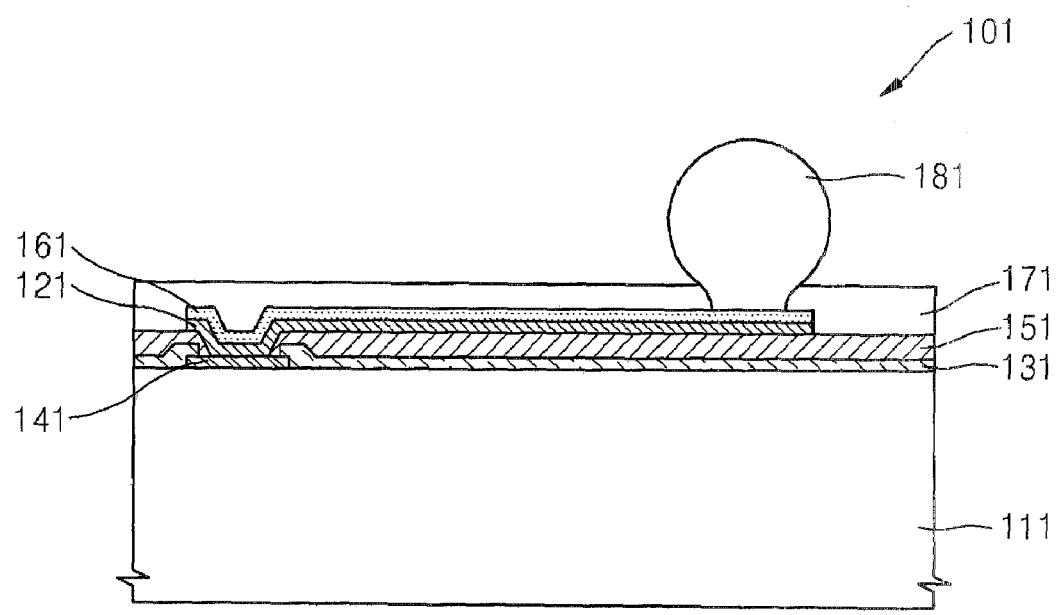
FIG. 1 is a cross-sectional view showing a conventional wafer level package.
Figure 2:
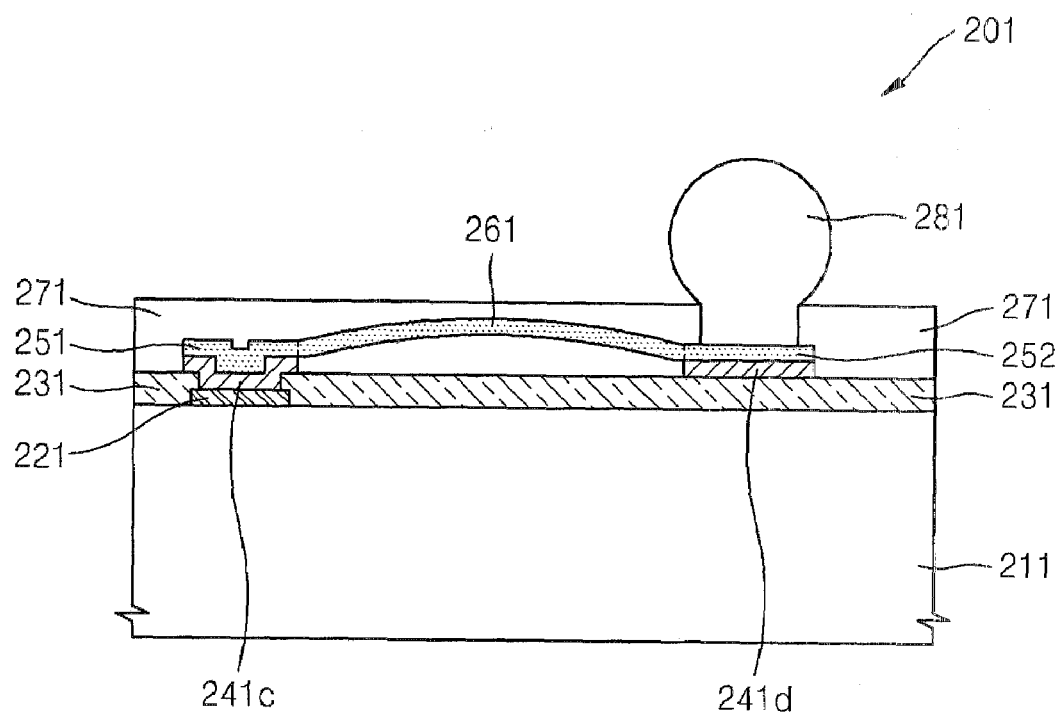
FIG. 2 is a cross-sectional view showing a wafer level package (WLP) having a floated metal line according to an embodiment of the present invention.

FIG. 2 is a cross-sectional view showing a wafer level package (WLP) having a floated metal line according to an embodiment of the present invention.

Referring to FIG. 2, the WLP 201 comprises, for example, a semiconductor chip 211, a bonding pad 221, a passivation layer 231, a first seed metal are 241c, a second seed metal area 241d, a first metal pad 251, a second metal pad 252, a metal line 261, an insulation layer 271, and an electrically conductive solder ball 281. The metal line 261 electrically connects the first metal pad 251 and the second metal pad 252 but does not contact the passivation layer 231. Instead, the metal line 261 is surrounded by the insulating layer 271. In this embodiment of the present invention, since the metal line 261 is suspended or floated from the passivation layer 231, and is surrounded by the insulting layer 271, the adhesion characteristics of the metal line 261 is superior and delamination caused by poor adhesion between a metal line and a polymer layer is avoided.

FIG. 3 to FIG. 8 are cross-sectional vies showing a method of manufacturing the wafer level package 201 according to an embodiment of the present invention.

Figure 3:
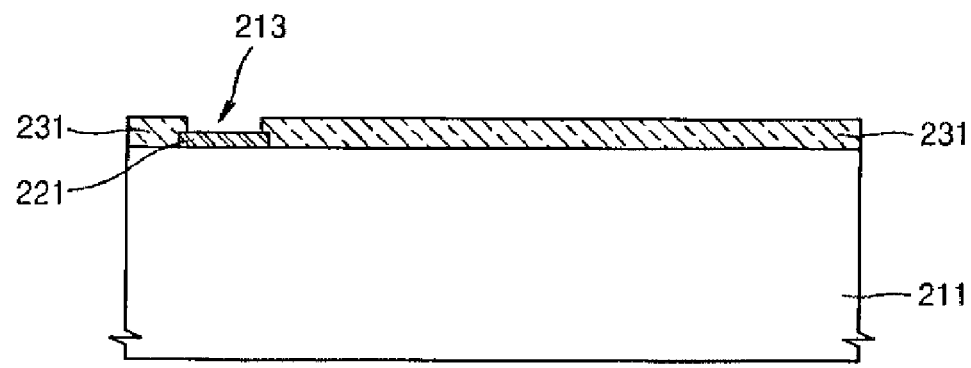
FIG. 3 to FIG. 8 are cross-sectional views showing a method of manufacturing the WLP according to an embodiment of the present invention.

Referring to FIG. 3, the bonding pad 221 is formed on the semiconductor chip 211. The bonding pad 221 can be connected to a circuitry (not shown) of the semiconductor chip 211. The passivation layer 231 is deposited on an active surface of the semiconductor chip 211, except leaving an opening 213 over the bonding pad 221.

Figure 4:
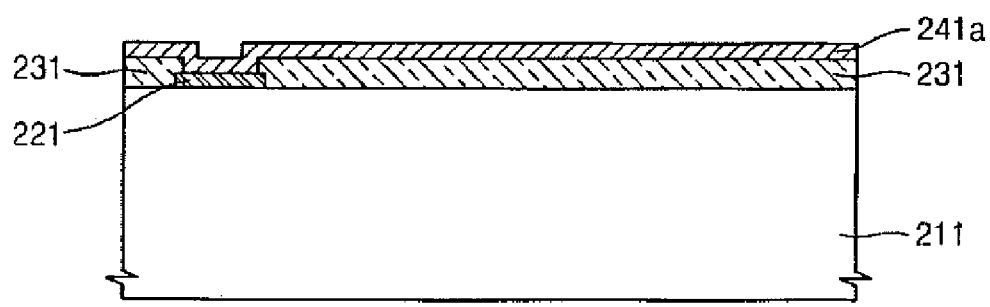

Referring to FIG. 4, a seed metal layer 241a is deposited on the bonding pad 221 and the passivation layer 231. In an embodiment of the present invention, the seed metal layer 241a can be deposited by, for example, sputtering. The seed metal layer 241a may comprise, for example, titanium (Ti), chrome (Cr), copper (Cu), nickel (Ni), or an alloy of any combination thereof. The seed metal layer 241a can have a thickness of about 1000 angstrom (Å) to about 5000 angstrom (Å).

Figure 5:
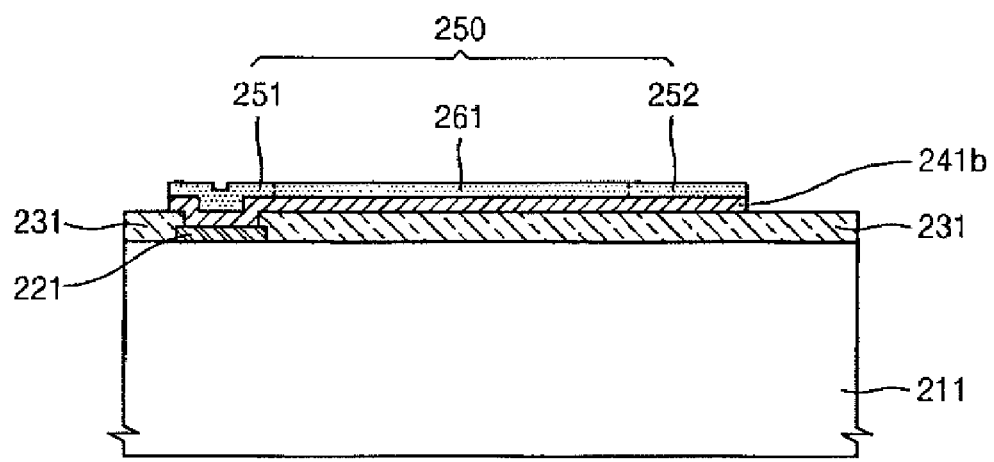

Referring to FIG. 5, the seed metal layer 241a is patterned to form a seed metal layer 241b. In an embodiment of the present invention, a metal layer 250 is deposited on the seed metal layer 241b by, for example, electroplating or electrolessplating. The metal layer 250 includes a first metal pad 251, a metal line 261, and a second metal pad 252. The second metal pad 252 is also referred to as a connection pad because the second metal pad 252 can be connected to outside circuitry such as, for example, a printed circuit board (PCB). The first metal pad 251 contacts the bonding pad 221 through the seed metal layer 241b. The metal line 261 connects the first metal pad 251 and the second metal pad 252. The metal layer 250 may comprise, for example, copper, chromium, nickel, gold, or an alloy of any combination thereof. The metal layer 250 can have a thickness of about 2 micron ($\mu$) to about 10 micron ($\mu$).

Figure 6:
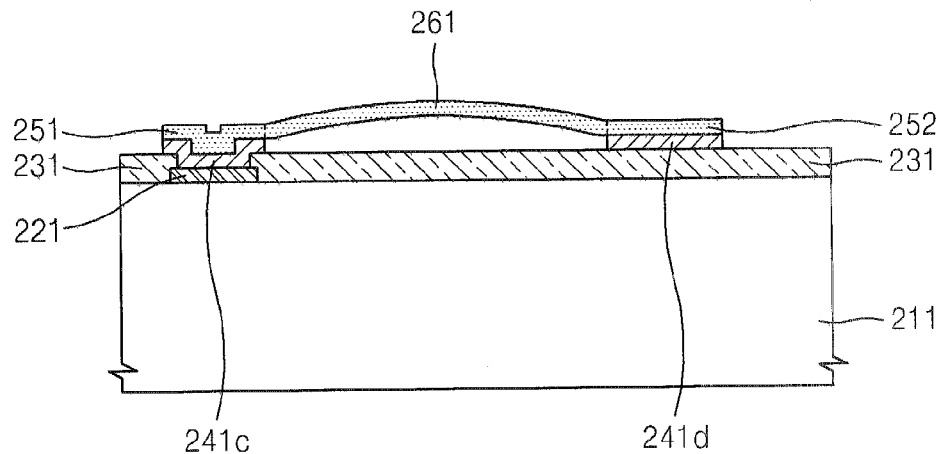

Referring to FIG. 6, selected portions of the seed metal layer 241 are etched, leaving unetched a first seed metal area 241c overlapping the bonding pad 221 and a second seed metal area 241d overlapping the second metal pad 252. Due to the etching process, the metal line 261 forms an arc, with the center portion pulling or floating away from the passivation layer 231. The first metal pad 251 and the second metal pad 252 are dimensioned to have a large footprint for better adhesion than the metal line 261 to the passivation layer 231. The metal line 261 forms an electrical connection between the bonding pad 221 and the second metal pad 252.

Figure 7:
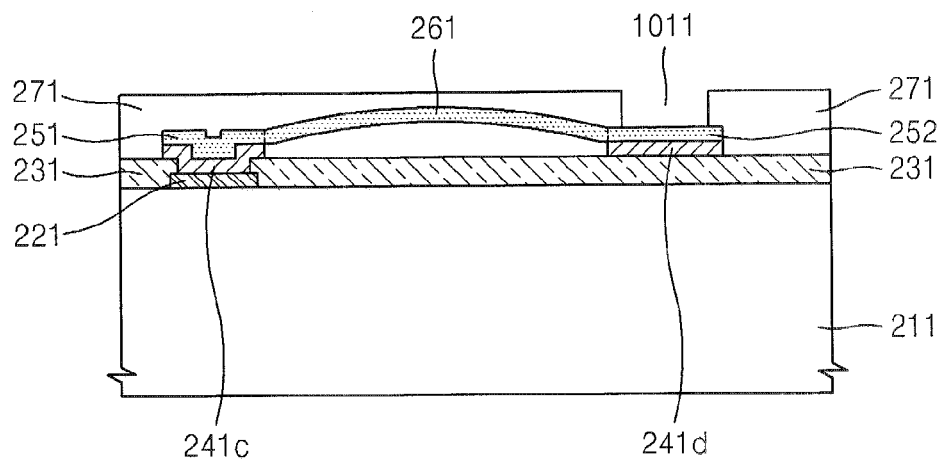

Referring to FIG. 7, an insulating layer 271 is deposited on the passivation layer 231, the first metal pad 251, the metal line 261, and the second metal pad 252. In an embodiment of the present invention, the insulating layer 271 can be formed by, for example, screen printing or spin coating. Then, an opening 1011 can be formed to expose the second metal pad 252. The opening can be formed using a photoresist process.

Figure 8:
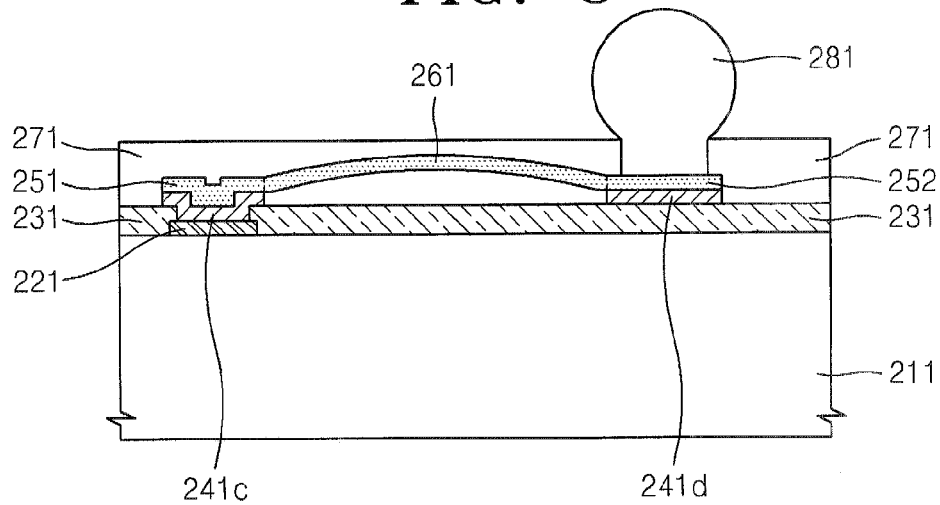

Referring to FIG. 8, the opening 1011 can be filled with an electrically conductive solder ball 281 comprising, for example, tin, lead or lead-free solder ball. In an embodiment of the present invention, after the opening 1011 is formed on the second metal pad 252, solder paste is deposited onto the opening 1011. The solder paste is then reflowed to form the conductive solder ball 281.

Figure 9:
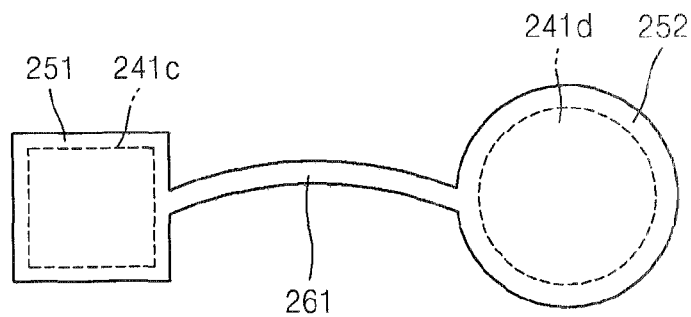
FIG. 9 is a top plan view illustrating a shape and size of a metal line according to an embodiment of the present invention.

FIG. 9 is a top plan view illustrating a shape and size of the first seed metal area 241c, the second seed metal area 241d, the first metal pad 251, the second metal pad 252, and the metal line 261 according to an embodiment of the present invention.

Referring to FIG. 9, the size of the first metal pad 251 is formed larger than the size of the first seed metal area 241c, and the size of the second metal pad 252 is formed larger than the size of the second seed metal are 241d. The size difference between the metal ad 251, 252 and the seed metal area 241c, 241d can be caused by the etching process with removes the peripheral portion of the seed metal are 241c, 241d.

Figure 10:
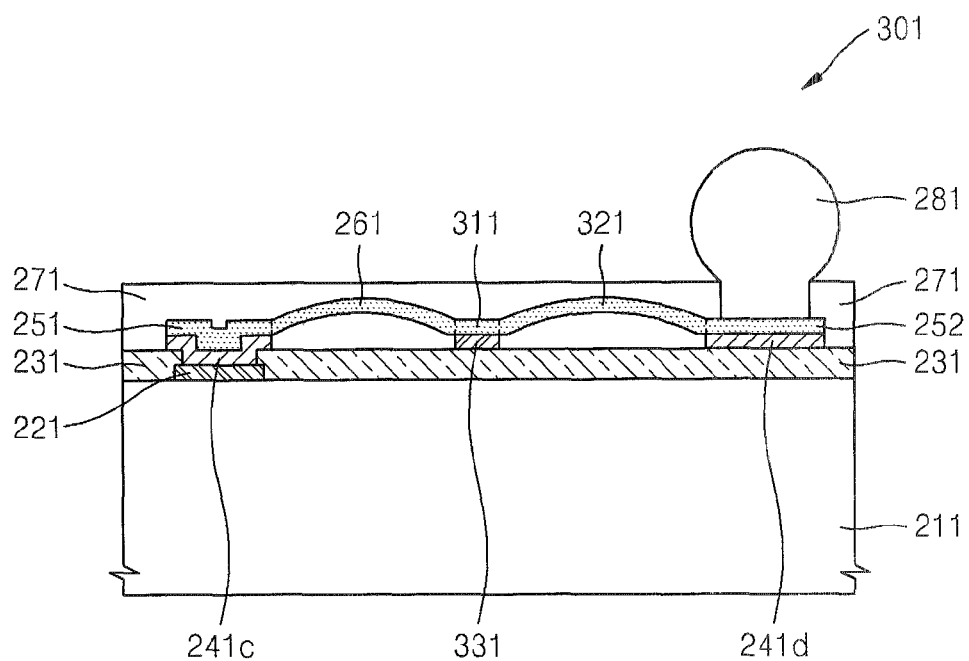
FIG. 10 is a cross-sectional view showing a wafer level package (WLP) having a floated metal line according to an embodiment of the present invention.

FIG. 10 is a cross-sectional view showing another wafer level package (WLP) according to an embodiment of the present invention.

Referring to FIG. 10, the WLP 301 comprises, for example, a semiconductor substrate 211, a bonding pad 221, a passivation layer 231, a first seed metal area 241c, a second seed metal area 241d, a third seed metal area 331, a first metal pad 251, a second metal pad 252, a third metal pad 311, a first metal line 261, a second metal line 321, an insulating layer 271, and an electrically conductive solder ball 281. The metal lines 261 and 321 electrically connect the first metal pad 251 and the second metal pad 252 but do not contact the passivation layer 231. The third metal pad 311 acts to anchor the metal wires 261 and 321. The metal lines 261 and 321 are surrounded by the insulation layer 271.

FIG. 11 to FIG. 16 are cross-sectional views showing a method of manufacturing the WLP according to an embodiment of the present invention.

Figure 11:
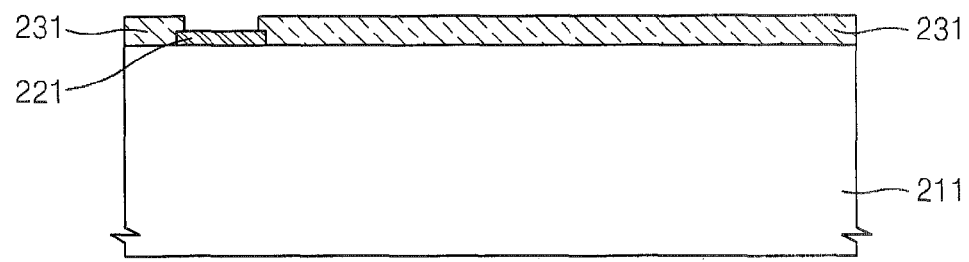
FIG. 11 to FIG. 16 are cross-sectional views showing a method of manufacturing a WLP according to an embodiment of the present invention.

Referring to FIG. 11, a bonding pad 221 is formed on the semiconductor chip 211. The bonding pad 221 is connected to a circuitry (not shown) of the semiconductor chip 211. A passivation layer 231 is deposited on an active surface of the semiconductor chip 211, except leaving an opening 213 over the bonding pad 221.

Figure 12:
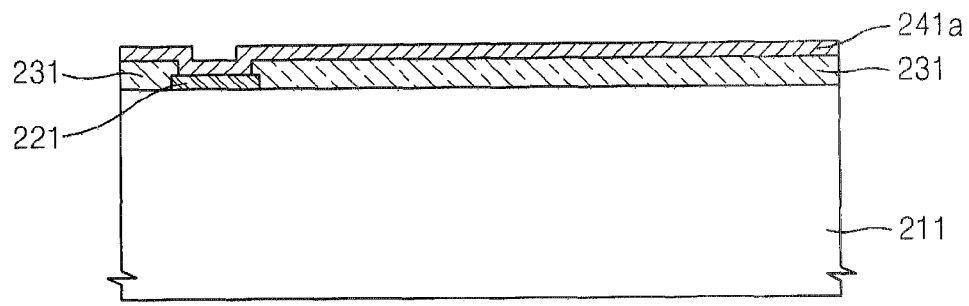

Referring to FIG. 12, a seed metal layer 241a is deposited on the bonding pad 221 and the passivation layer 231. The seed metal layer 241 can be deposited by, for example, sputtering. The seed metal layer 241a may comprise, for example, titanium (Ti), chrome (Cr), copper (Cu), nickel (Ni), or an alloy of any combination thereof. The seed metal layer 241 can have a thickness of about 1000 angstrom (Å) to about 5000 angstrom (Å).

Figure 13:
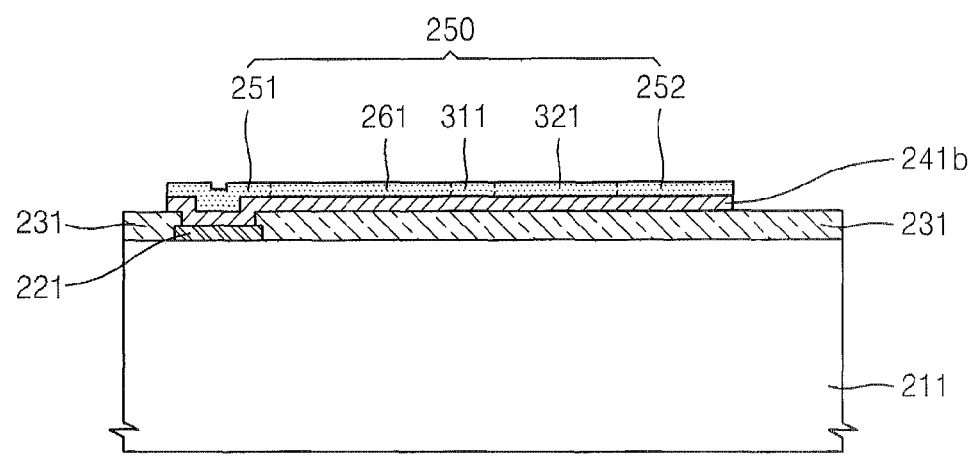

Referring to FIG. 13, the seed metal layer 241a is patterned to form the seed metal layer 241b. Then, a metal layer 250 is deposited on the seed metal layer 241b by, for example, electroplating or electrolessplating. The metal layer 250 includes a first metal pad 251, a first metal line 261, a third metal pad 311, a second metal line 321 and a second metal pad 252. The first metal pad 251 contact the bonding pad 221. The first metal line 261, the second metal line 321, and the third metal pad 311 connect the first metal pad 251 and the second metal pad 252. In an embodiment of the present invention, the third metal pad 311 can be formed substantially in the center portion between the first metal pad 251 and the second metal pad 252. The metal layer 250 may comprise, for example, copper, chromium, nickel, gold, or an alloy of any combination thereof. The metal layer 250 can have a thickness of about 2 micron ($\mu$) to about 10 micron ($\mu$).

Figure 14:
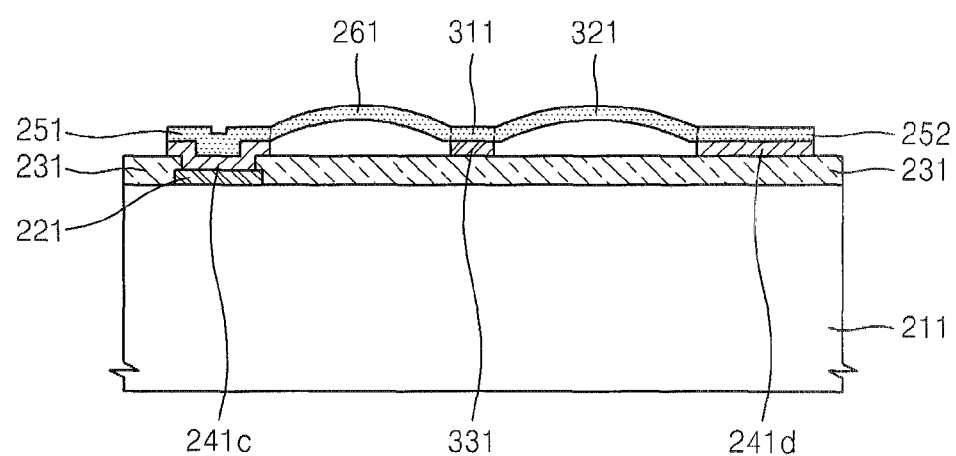

Referring to FIG. 14, selected portions of the seed metal layer 241b are etched leaving unetched a first seed metal area 241c overlapping the bonding pad 221, a second seed metal area 241d overlapping the second metal pad 252, and a third seed metal area 331 overlapping the third metal pad 311. As can be seen, the first metal line 261 and the second metal line 321 form an arc, respectively, with the center portion pulling or floating away from the passivation layer 231, wherein the third metal pad 311 acts to anchor the first metal line 261 and the second metal line 321.

Figure 15:
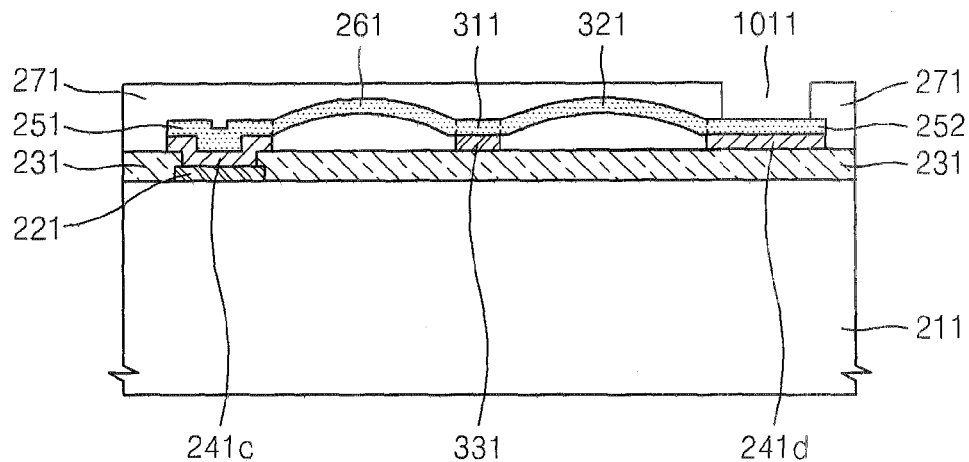

Referring to FIG. 15, an insulating layer 271 is deposited on the passivation layer 231, the first metal pad 251, the first metal line 261, the second metal line 321, the second metal pad 252, and the third metal pad 311. The insulating layer 271 can be formed by, for example, screen printing or spin coating. An opening 1011 is formed at the second metal pad 252. The opening 1001 can be formed using a photoresist process.

Figure 16:
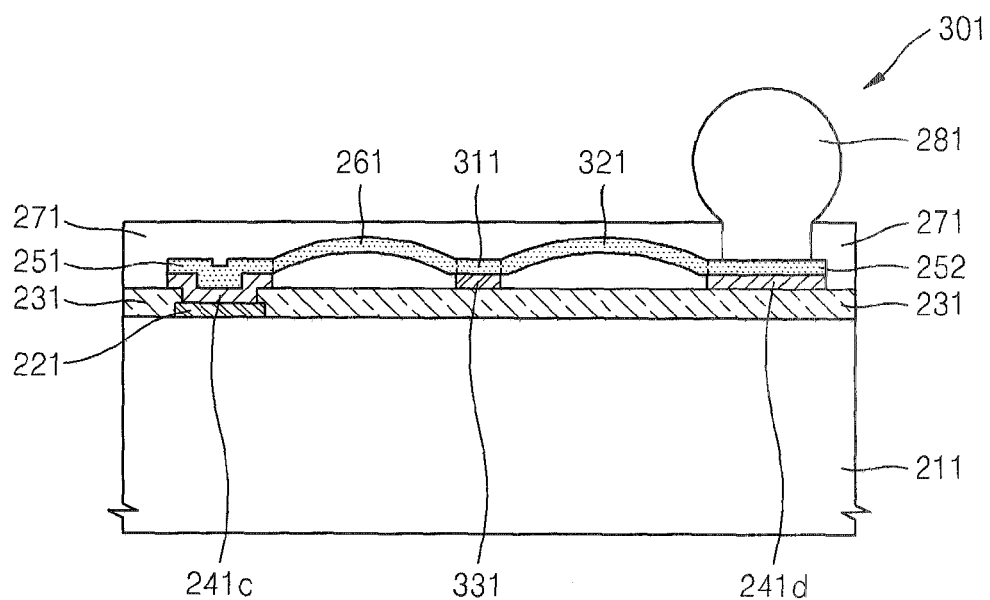

Referring to FIG. 16, the opening 1011 can be filled with an electrically conductive solder ball 281 comprising, for example, tin, lead or lead-free solder ball. In an embodiment of the present invention, after the opening 1011 is formed on the second metal pad 252, solder paste is deposited onto the opening 1011. The solder paste is then reflowed to form the conductive solder ball 281.

Figure 17:
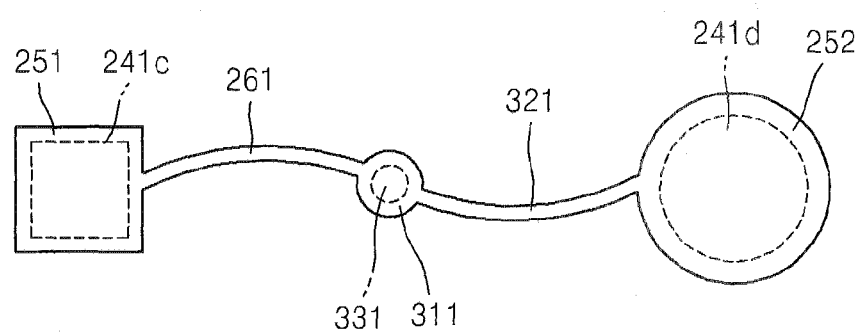
FIG. 17 is a top plan view illustrating a shape and size of a metal line according to an embodiment of the present invention.

FIG. 17 is a top plan view illustrating a shape and size of the first seed metal area 241c, the second seed metal area 241d, the first metal pad 251, the second metal pad 252, the third seed metal area 331, the third metal pad 311, the first metal line 261, and the second metal line 321 according to an embodiment of the present invention.

Referring to FIG. 17, the first and second metal lines 261, 321 can be an S-curved line. The S-curved structure enables the metal lines 261 and 321 to be easily floated. The size of the first metal pad 251 is formed larger than the size of the first seed metal area 241c. The size of the second metal pad 252 is formed larger than the size of the second seed metal area 241d. The size of the third metal pad 311 is formed larger than the size of the third seed metal area 331. These size differences can be caused by the etching process which removes the peripheral portions of each of the seed metal areas 241c, 241d and 331.

In this embodiment of the present invention, the floated metal lines 261 and 321 surrounded by the insulating layer 271 have superior adhesion characteristics and avoid delamination caused by poor adhesion between a metal line and a polymer layer. Further, the third metal pad 311 acts to anchor the metal wire and shorten the length of the metal wire connecting the first metal pad 251 and the second metal pad 252. In such configuration, breakage of the floated metal lines 261 and 321 is further minimized.

Although preferred embodiments have been described herein with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of forming a wire structure coupling to a bonding pad of a semiconductor chip, comprising:
    forming a passivation layer on an active surface of the semiconductor chip;
    forming a seed metal layer on the bonding pad and the passivation layer;
    forming a metal layer on the seed metal layer;
    etching selected portions of the seed metal layer, leaving unetched a first area overlapping the bonding pad and a second area overlapping a connection pad, wherein the wire structure is formed by the metal layer being electrically connected to the bonding pad and the connection pad, but floating from the passivation layer; and
    forming an insulating layer on the wire structure,
    wherein a bottom surface, an upper surface and a side surface of the wire structure is surrounded by the insulating layer.

2. The method of claim 1, further including:
    forming an opening at the connection pad to expose the metal layer; and
    filling the opening with an electrically conductive mass.

3. The method of claim 1, further including:
    forming an opening at the connection pad to expose the metal layer; and
    interconnecting a wire to the connection pad.

4. The method of claim 1, wherein the size of the metal layer at the bonding pad is made larger than the size of the seed metal layer.

5. The method of claim 1, wherein the seed metal layer is made of titanium, copper, chromium, nickel, or an alloy of any combination thereof.

6. The method of claim 1, wherein the seed metal layer has a thickness of about 1000 to 5000 angstrom.

7. The method of claim 1, wherein the seed metal layer is formed by sputtering.

8. The method of claim 1, wherein the metal layer includes one of copper, chromium, nickel, gold, or an alloy of any combination thereof.

9. The method of claim 1, wherein the metal layer has a thickness of about 2 to about 10 micron.

10. The method of claim 1, wherein forming the metal layer includes electroplating or electrolessplating.

11. The method of claim 2, wherein the electrically conductive mass includes one of tin, lead, or lead-free solder ball.

12. A method of forming a wire structure connecting to a bonding pad in a semiconductor chip, comprising:
    forming a passivation layer on an active surface of the semiconductor chip;
    forming a seed metal layer on the bonding pad and the passivation layer;
    forming a metal layer on the seed metal layer;
    etching selected portions of the seed metal layer, leaving unetched a first area overlapping the bonding pad, a second area overlapping a connection pad, and a third area overlapping a metal pad in between the bonding pad and the connection pad, wherein the wire structure is formed by the metal layer being electrically connected to the bonding pad, the metal pad, and the connection pad, but otherwise floating from the passivation layer; and
    forming an insulating layer on the wire structure,
    wherein a bottom surface, an upper surface and a side surface of the wire structure is surrounded by the insulating layer.

13. The method of claim 12, further including:
    forming an opening at the connection pad to expose the metal layer; and
    filling the opening with an electrically conductive mass.

14. The method of claim 12, further including:
    forming an opening at the connection pad to expose the metal layer; and
    interconnecting a wire to the connection pad.

15. The method of claim 12, wherein the size of the metal layer at the bonding pad is made larger than the size of the seed metal layer.

16. The method of claim 12, wherein the seed metal layer is made of titanium, copper, chromium, nickel, or an alloy of any combination thereof.

17. The method of claim 12, wherein the seed metal layer has a thickness of about 1000 to 5000 angstrom.

18. The method of claim 12, wherein the seed metal layer is formed by sputtering.

19. The method of claim 12, wherein the metal layer includes one of copper, chromium, nickel, gold, or an alloy of any combination thereof.

20. The method of claim 12, wherein the metal layer has a thickness of about 2 to about 10 micron.

21. The method of claim 12, wherein forming the metal layer includes electroplating or electrolessplating.

22. The method of claim 13, wherein the electrically conductive mass includes one of tin, lead, or lead-free solder ball.

* * * * *